United States Patent [19]

Copeland, III

[11] 4,305,048
[45] Dec. 8, 1981

[54] MODE STABILIZED SEMICONDUCTOR LASER

[75] Inventor: John A. Copeland, III, Fair Haven, N.J.

[73] Assignee: Bell Telephone Laboratories, Incorporated, Murray Hill, N.J.

[21] Appl. No.: 89,036

[22] Filed: Oct. 29, 1979

[51] Int. Cl.³ .............................................. H01S 3/19
[52] U.S. Cl. .............................. 331/94.5 H; 357/16; 357/17
[58] Field of Search ............... 331/94.5 H; 357/16, 357/17, 18

[56] References Cited

U.S. PATENT DOCUMENTS

| | | | |
|---|---|---|---|
| 3,654,497 | 4/1972 | Dyment et al. | 331/94.5 H X |
| 3,758,875 | 9/1973 | Hayashi | 331/94.5 H |
| 4,055,815 | 10/1977 | Smith | 331/94.5 H |
| 4,132,960 | 1/1979 | Streifer | 331/94.5 H |
| 4,158,207 | 6/1979 | Bishop et al. | 331/94.5 H |

OTHER PUBLICATIONS

Nakamura et al., "Longitudinal-mode Behaviors of Mode-stabilized $Al_xGa_{1-x}As$ Injection Lasers", *J. Applied Physics*, vol. 49, No. 9, Sep. 1978, pp. 4644–4648.

*Primary Examiner*—James W. Davie
*Attorney, Agent, or Firm*—Daniel D. Dubosky

[57] ABSTRACT

Longitudinal mode control is achieved in a heterojunction semiconductor laser (201-208) by doping the active region (203) of the laser with a deep level electron or hole trap. The trap is chosen to have a carrier capture cross section $\sigma_e$ and an optical cross section $\sigma_o$ such that the ratio of P, the average number of photons per cubic centimeter, to $P_s$ is between 0.1 and 100 where $P_s$ is equal to $(N\sigma_e V/\sigma_o C_o)$, N is the carrier density, V is the carrier thermal velocity, and $C_o$ is the speed of light in the material. In a specific embodiment the active region is bombarded by photons to achieve deep level electron traps in the active region.

6 Claims, 4 Drawing Figures

MODE STABILIZED SEMICONDUCTOR LASER

BACKGROUND OF THE INVENTION

Conventional double heterostructure diode lasers generally lase at several longitudinal modes simultaneously. Since each longitudinal mode is at a different wavelength this type of laser is not as useful as it might be if its output could be restricted to a single dominant longitudinal mode. Specifically, the applications requiring coherence, for example holography, could be carried out with a single mode laser but not as effectively with one that emits multiple modes. In addition, single mode optical fibers are best served by an optical source having a single dominant output wavelength.

One technique for achieving longitudinal mode control in a double heterostructure laser is set forth in U.S. Pat. No. 4,132,960 issued Jan. 2, 1979, to W. Streifer, et al. In this patent the active region of a double heterostructure semiconductor laser is heavily doped with a dopant such as zinc or germanium with a density of approximately $10^{19}$ /cm$^3$. This technique of using a heavy doping intensity of the active region has been found to achieve longitudinal mode control in lasers that are operating at high pulse powers. The high density dopants essentially prevent hole burning in the carrier density or gain. In low powered continuous semiconductor lasers having outputs in the order of 1 to 10 μwatts this technique of high density dopants is not effective in achieving longitudinal mode control.

Longitudinal mode control in a double heterostructure semiconductor laser has recently been observed by N. Nakamura, et al as reported in their article entitled "Longitudinal-mode behaviors of mode-stabilized Al$_x$Ga$_{1-x}$As injection lasers" *Applied Physics*, Vol. 49, No. 9, September 1978, pages 4644–4648. The laser reported in this Nakamura et al article was said to lock onto one mode and remain in that mode even though temperature variations of several degrees were encountered. The article attributes this behavior to some type of "reduction of gain around a lasing mode" based on a nonpublished analysis by M. Yamada and Y. Suematsu of Japan. There is no disclosure in the article as to how to construct a laser to duplicate these results.

SUMMARY OF THE INVENTION

An analysis of the laser used in the Nakamura et al article has caused me to conclude that the longitudinal mode control achieved in that laser is due primarily to a decrease in loss at the lasing wavelength rather than the reduction in gain at the adjacent mode wavelengths that is suggested by the article. The decrease in loss that is achieved at the dominant mode wavelength is due primarily to the presence of a deep level DX center associated with each of the donors in the n-type cladding layer on one side of the active region. In the case of the laser reported in that article, the thickness of the active region was relatively small, in the order of 0.1 micrometer, and therefore much of the radiant energy was present in the cladding layer thereby permitting the deep level DX centers in the cladding layer to have an effect. An active region thickness of 0.1 micrometer is very low from the standpoint of achieving optimization of the threshold current. In this regard, it would be highly desirable to have a thicker active region. With a thicker active region, however, the deep level DX centers, due to the donors in a cladding layer, would have a considerably reduced effect on the radiant energy. It would therefore be highly desirable to achieve mode stabilization by some technique other than the deep level centers contributed by the donors in the cladding layer.

In accordance with the present invention longitudinal mode stabilization is achieved in a heterostructure semiconductor laser by establishing a predetermined density of deep level electron or hole traps, $T_o$, within the active region either by ion bombarding the active region or by adding elements such as oxygen, chromium, or iron. The predetermined density can be determined by picking a dopant, or intensity of ion bombardment, that will achieve a ratio of $(P/P_s)$ of between 0.1 and 100 where P is the average number of photons/cm$^3$ and $P_s$ is equal to $(N\sigma_e V/\sigma_o C_o)$ where N is the carrier density, $\sigma_e$ is the carrier capture cross section of an empty trap, V is the carrier thermal velocity, $\sigma_o$ is the optical cross section of a trap, and $C_o$ is the speed of light in the material. The number of photons/cm$^3$, P, is related to the power, W, by the following relationship:

$$W = \frac{(1-R)}{(1+R)} PAC_o$$

where R is the mirror reflectivity and A is the area of the active region. For the type of traps that are created by ion bombarding, sufficient traps must be added to the active region in order to achieve an optical absorption parameter, $T_o\sigma_o$, corresponding to these traps of 1 to 6 cm$^{-1}$.

DETAILED DESCRIPTION

Figure 1:
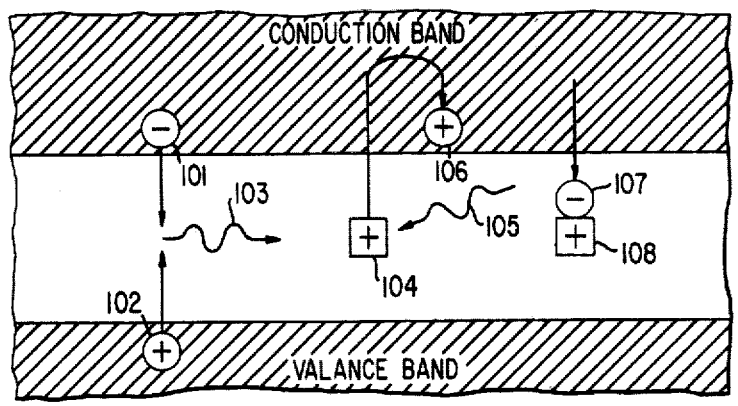
FIG. 1 is a display of energy levels in a semiconductor laser useful in explaining the operation of the present invention.

In the energy level diagram of FIG. 1, the combination of an electron 101 in the conduction band and a hole 102 from the valence band to produce a photon 103 represents the normal electron-hole combination that takes place to produce photons in a semiconductor laser. If deep level traps, such as the one indicated by the numeral 104, are present in the energy band between the valence band and conduction band, these deep level traps can exhibit a loss to the photons that are present in the active region. These traps are deep level in the sense that their energy level is more than a few kT removed from the conduction and valence bands, where k is Boltzmann's constant and t is the absolute temperature. In FIG. 1 where trap 104 is an electron trap, that is, one that normally has an electron associated with the trap, the combination of a photon 105 and trap 104 causes its associated electron to be driven up into the conduction band as indicated in FIG. 1. This absorption of photon 105 contributes to the loss of the active region in the laser. Electrons from the conduction band can recombine with the trap as illustrated by electron 107 and trap 108 thereby causing either the emission of thermal energy or the emission of a photon at wavelengths that are not of importance with respect to the laser operation. Normally the latter recombinations are of the nonradiative type.

Figure 3:
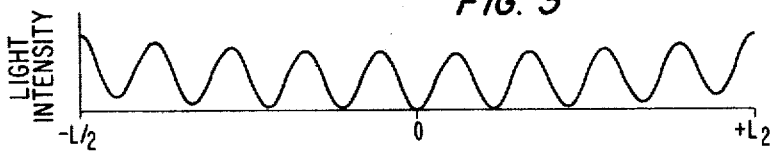
FIG. 3 is a graph of light intensity versus distance along the laser useful in describing the operation of the invention.

As will be appreciated by those skilled in the art, the electrons are disassociated from their corresponding traps most heavily in the regions of high optical intensity. The light intensity versus distance along the laser for the dominant mode in a semiconductor laser is illustrated in FIG. 3 of the drawings. The number of cycles shown in FIG. 3 has been greatly reduced from those that are actually present in a semiconductor laser to clarify the presentation. The dominant mode in a semiconductor laser can frequently have hundreds of cycles of light intensity peaks and valleys along the length of the semiconductor laser. At points in the active region where the light intensity is at a maximum, the largest number of traps will be emptied of their electrons, and correspondingly the points where the light intensity is at a minimum will have the maximum number of filled traps.

Figure 2:
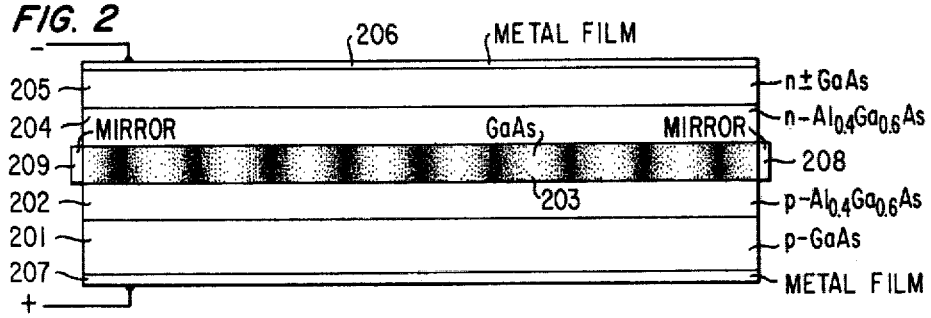
FIG. 2 is a diagram that illustrates a semiconductor laser that is constructed in accordance with the present invention.

This effect of having an active region in which the density of filled traps varies periodically throughout the length of the active region is illustrated in FIG. 2. The laser shown in FIG. 2 consists of a p-type gallium arsenide substrate 201, a cladding layer 202 consisting of p-type $Al_{0.4}Ga_{0.6}As$. Next layer in the laser of FIG. 2 is the gallium arsenide layer 203 which has been bombarded with protons having a density of $10^{13}$ cm$^{-2}$ and using an accelerating potential sufficient to drive the protons through the active layer. The protons will penetrate to a depth of about one micron for every 100 kilovolts of accelerating potential. This intensity of ion bombarding will create electron traps in the active region having a density such that the optical absorption parameter corresponding to these traps in the active region is approximately 6 cm$^{-1}$. Other levels of trap density may be created in the active region by using other proton densities. For guidance, see the article "Electrical Measurement of the Lateral Spread of the Proton Isolation Layer in GaAs" by H. Matsumura and K. G. Stephens, *Journal of Applied Physics*, Vol. 48, No. 7, July 1977, pages 2779-2783.

An n-type cladding layer 204 consisting of $Al_{0.4}Ga_{0.6}As$ is deposited on the active region layer 203, and finally a highly doped n-type layer 205 of gallium arsenide is deposited on cladding layer 204 in order to ease making a metal electrical contact 206 to the laser. A metal film 207 is deposited on the substrate 201 to provide the other electrical contact to the laser diode. Mirrors 209 and 208 are deposited on the ends of the active region to establish the Fabry-Perot cavity.

To indicate the intensity of the filled traps in the active region, the active region layer 203 in FIG. 2 has been speckled with the highest density speckling indicating the highest density of filled traps. As indicated by a comparison of FIGS. 2 and 3 in the drawings, the highest density of empty traps occurs at the points where the light intensity for the dominant mode is at a peak. Here again in FIG. 2 as in FIG. 3 the number of cycles shown for the variations in empty or filled trap density is considerably reduced from what occurs in an actual laser simply for the purposes of clarity.

Figure 4:
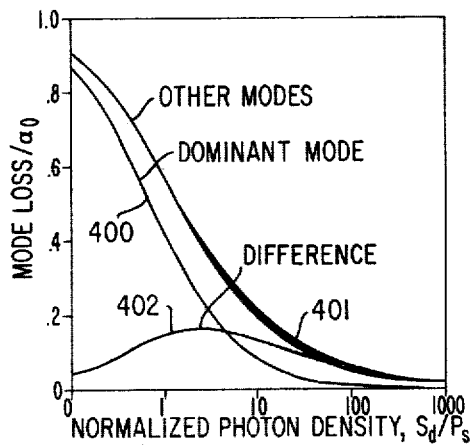
FIG. 4 is a graph of normalized mode loss versus normalized photon density for the dominant and other modes operative in a semiconductor laser.

As pointed out hereinabove, the filled trap essentially presents a loss in that it is capable of absorbing a photon and therefore the variation in the density of filled (or empty) traps that occurs in the active region essentially creates a loss grating in the active region of the laser. As is pointed out in the appendix to this specification, the loss that is present in the active region for modes other than the dominant mode is higher because the light intensity peaks for these other modes occasionally occur at points in the active region where there is a high density of filled traps. By using the mathematical analysis set forth in the appendix a plot of the normalized mode loss for each of the modes versus a normalized light intensity can be obtained. Such a plot is shown in FIG. 4 of the drawings. Curve 400 provides the normalized mode loss versus normalized photon density for the dominant mode present in the laser, whereas curve 401 is a plot of the mode loss versus normalized photon density for all of the other modes present in the active region of the laser. Curve 401 is actually a family of curves, but many of the modes have substantially identical mode loss particularly for the lower values of normalized photon density.

For the range of normalized photon density shown in FIG. 4, the dominant mode has a lower loss than the other modes and this difference is illustrated by curve 402. The normalized mode loss in FIG. 4 is equal to the mode loss divided by $\alpha_o$ which represents the optical absorption parameter due to the traps at initial or low light levels in the active region. The normalized photon density in FIG. 4 is equal to $S_d/P_s$ where $S_d$ is the amplitude of the dominant mode, and $P_s$ is equal to the photon density at which half the traps are empty and therefore the optical absorption parameter is decreased by one half. If one mode is dominant, the average number of photons/cm$^3$, P, is approximately equal to $S_d$.

Equation 7 of the appendix gives the precise equation for $P_s$, and as indicated by this equation, the $P_s$ parameter is proportional to a ratio of $\sigma_e$, the carrier capture cross section, to $\sigma_o$, the optical cross section of the filled trap. The optical cross section of traps that can be created by dopants or ion bombarding is known to have a range of about $10^{-14}$ to $10^{-21}$ cm$^{-2}$. Similarly the carrier capture cross section of an empty trap is known to also have a range of $10^{-14}$ to $10^{-21}$ cm$^{-2}$. Accordingly, it is possible for the ratio of $\sigma_e$ to $\sigma_o$ to range over 14 orders of magnitude.

The present invention can be practiced by first determining the output power that is to be generated by the laser under consideration. This output power will determine P, the average number of photons/cm$^3$. The type of electron (or hole) trap must then be selected in order to achieve a $P_s$ that is equal to a value between 0.1P and 100P. This choice of type of trap will ensure that a significant difference in trap population occurs between the peaks and valleys of the optical standing wave pattern. If the density of this type of trap is sufficient, a significant difference in mode loss will exist between the dominant mode and all other modes present in the active region. As indicated in FIG. 4, the most optimum value of $P_s$ is between P and 10P. As a result, the laser will operate with most of its energy in a single dominant mode and therefore emit a single wavelength.

What has been described hereinabove is merely an illustrative embodiment of the present invention. Numerous departures may be made by those skilled in the art without departing from the spirit and scope of the present invention. For example, the deep level traps may be created by means other than ion bombarding the active region. The deep level traps may result from the addition of a dopant such as oxygen, iron and chromium during the manufacture of the laser. For guidance in achieving different values of dopant densities, see the article entitled "Preparation and Properties of Semi-insulating Liquid Phase Epitaxial Gallium Arsenide for Application to FET Devices" by Y. Houng, Technical Report No. 5125-1, Solid State Electronics Laboratory, Stanford University, January 1977.

APPENDIX

In my article entitled "Semiconductor Self-Pulsing Due to Deep-Level Traps", *Electronics Letters*, Vol. 14, pages 809–810, Dec. 7, 1978, a rate equation is derived for deep levels in a laser and used to explain sustained pulsations. This equation can also be used to derive the local optical absorption $\alpha$ as a function of the local photon density P (light intensity). First $$\frac{dT}{dt} = \sigma_o C_o P(T_o - T) - \sigma_e V N T \qquad (1)$$

where T is the number of empty traps (whose electron or hole has been freed by optical stimulation into the conduction or valence band), $\sigma_o$ is the optical cross-section, $C_o$ is the speed of light in the material, $T_o$ is the total number of traps, $\sigma_e$ is the carrier capture cross-section of an empty trap, N is the carrier density, and V is the carrier thermal velocity. The optical absorption, $\alpha$, is $\sigma_o$ times the density of filled traps, that is, $$\alpha = \sigma_o (T_o - T) \qquad (2)$$

For a laser which is stable, the left side of (1) is zero and therefore $$\alpha = \frac{\sigma_o T_o}{1 + [\sigma_o C_o / \sigma_e V N] P} \qquad (3)$$

This equation can be simplified by writing it in terms of $\alpha_o$, the initial (low light) absorption due to traps, and $P_s$, the photon density where the absorption decreased by half. Then $$\alpha(P) = \frac{\alpha_o}{1 + (P/P_s)} \qquad (5)$$

where by definition $$\alpha_o = \sigma_o T_o \text{ and} \qquad (6)$$

$$P_s = N \sigma_e V / \sigma_o C_o. \qquad (7)$$

Recently this type of saturable optical absorption was observed in Al$_{0.4}$Ga$_{0.6}$As as doped with Te by J. P. Merz, J. F. van der Ziel, and R. A. Logan. See the article, "Optical Absorption and Saturation of the Deep Te-Complex Center in Al$_x$Ga$_{1-x}$As", *Physics Review* July 15, 1979. This type of material is commonly used as a cladding layer in AlGaAs lasers. There appeared to be one deep level for each shallow donor, possibly due to lattice-defect complexing (similar behavior is expected for other common shallow donors, such as tin). The measured value of $\alpha_o$ in Al$_{0.4}$Ga$_{0.6}$Ac at 300° K. was 6 cm$^{-1}$; however, in a laser structure with an 0.1 μm thick active layer (as in the above-identified Nakamura et al article), about forty percent of the light is in the cladding layer so an effective value of $\alpha_o = 2.4$ cm$^{-1}$ can be used in the calculations to follow. The measured values of $\sigma_o$ and $\sigma_n$ were $6 \times 10^{-17}$ cm$^2$ and $5 \times 10^{-17}$ cm$^2$ respectively which indicated P$_s$ was about $8 \times 10^{14}$ photons/cm$^3$. This corresponds to the average photon density in a laser emitting about 8 mW from a 0.1 by 5 μm facet.

To compute the average loss for various modes when one mode predominates, it is assumed that the loss due to absorption by the traps can be calculated by first finding $\alpha(x)$ due to the photon density P$_d$(x) of the dominant mode (whose mode number is d)

$$P_d(x) = S_d |\exp(\beta_d x) - (-1)^d \exp(-\beta_d x)|^2 \qquad (8)$$

$$\beta_d = \gamma_d + i 2\pi / \lambda_d \qquad (9)$$

where x is zero at the center of the stripe and the mirrors are located at $x = -L/2$ and $L/2$. The mode amplitude is S$_d$ and the wavelength in the cavity is $\lambda_d$. The average optical gain parameter of the dominant mode $\gamma_d$ is approximately equal to the cavity loss $\alpha_c$ which, in the simplest case, is related to the mirror reflectivity R by $$\alpha_c = L n(1/R) / L \qquad (10)$$

Now $\alpha(x)$ can be calculated using equations (5) and (8) for a given set of values of S$_d$/P$_s$, $\alpha_o$, L, and R.

To calculate the loss due to traps for the various modes, it was assumed that the photon density for the "n"th mode would be given by equation (8) if the mode number d was replaced by n. The wavelength of mode n in the device is given by $$\lambda_n' = L/2n \qquad (11)$$

The wavelength in air $\lambda_n$ is 3.65 times longer. The average loss $\alpha_n$ is found by averaging $\alpha(x)$ with the normalized photon density as a weighting function.

$$\alpha_n = \frac{\int_o^L \alpha(x) P_n(x) dx}{\int_o^L P_n(x) dx} \qquad (12)$$

The dominant mode will have the lowest mode loss because $\alpha(x)$ is always small when P$_d$(x) is high and vice versa. All other modes have a higher loss because their standing-wave maxima are frequently situated in regions of higher loss.

FIG. 4 shows a plot of the average loss for the dominant mode and other modes as a function of the average photon density at the center, S$_d$, divided by the saturation parameter of the trap P$_s$. When one mode is dominant, the average number of photons per cm$^3$, P, is approximately equal to S$_d$. Also plotted is the difference in average loss between the adjacent modes and the dominant mode which is the important parameter for mode stabilization.

I claim:

1. In a semiconductor diode laser having an active region layer (203) and a confinement layers (202 and 204) bordering said active region layer, at least one of the confinement layers having a lower refractive index than the refractive index of the active region layer, and at least one of the confinement layers being doped differently than the active region layer;

characterized in that
the active region layer is doped with deep level traps having a carrier capture cross section, $\sigma_e$, and an optical cross section, $\sigma_o$, such that the ratio of P, the average number of photons per cubic centimeter, to $P_s$ is between 0.1 and 100 where $P_s = (N\sigma_e V/\sigma_o C_o)$, N is the carrier density, V is the carrier thermal velocity and $C_o$ is the speed of light in the material.

2. In a semiconductor diode laser as defined in claim 1 wherein said active region layer has deep level electron traps created by ion bombarding said active region layer.

3. In a semiconductor diode laser as defined in claim 2 wherein the active region is made of GaAs which has been bombarded by photons having a density of approximately $10^{13}$ cm$^{-2}$ using an accelerating potential sufficient to drive the protons through the active layer.

4. In a semiconductor diode laser as defined in claim 1 wherein the deep level traps in said active region are created by doping said active region with an element from the group consisting of chromium, iron and oxygen.

5. In a semiconductor diode laser as defined in claim 2 wherein the density of deep level traps in said active region is such that the optical absorption parameter corresponding to these traps is equal to about 6 cm$^{-1}$.

6. A semiconductor diode laser comprising an active region layer, confinement layers bordering said active region layer, electrode means for providing a potential between said confinement layers, and means for reflecting light energy at opposite ends of said active region layer thereby forming an optical resonant cavity in said active region layer, characterized in that the active region layer is doped with deep level traps having a carrier capture cross section, $\sigma_e$, and an optical cross section, $\sigma_o$, such that the ratio of P, the average number of photons per cubic centimeter, to $P_s$ is between 0.1 and 100 where $P_s = (N\sigma_e V/\sigma_o C_o)$, N is the carrier density, V is the carrier thermal velocity and $C_o$ is the speed of light in the material.

* * * * *